(12) United States Patent
Cao

(10) Patent No.: US 12,118,909 B2
(45) Date of Patent: Oct. 15, 2024

(54) GATE DRIVE CIRCUIT AND DISPLAY PANEL

(71) Applicant: WUHAN CHINA STAR OPTOELECTRONICS TECHNOLOGY CO., LTD., Wuhan (CN)

(72) Inventor: Haiming Cao, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 30 days.

(21) Appl. No.: 17/434,561

(22) PCT Filed: Jun. 18, 2021

(86) PCT No.: PCT/CN2021/100902
§ 371 (c)(1),
(2) Date: Dec. 15, 2022

(87) PCT Pub. No.: WO2022/257170
PCT Pub. Date: Dec. 15, 2022

(65) Prior Publication Data
US 2024/0021117 A1    Jan. 18, 2024

(30) Foreign Application Priority Data
Jun. 8, 2021  (CN) .......................... 202110634626.8

(51) Int. Cl.
G09G 3/20 (2006.01)

(52) U.S. Cl.
CPC ....... *G09G 3/20* (2013.01); *G09G 2300/0408* (2013.01); *G09G 2310/0267* (2013.01)

(58) Field of Classification Search
CPC ............. G09G 3/20; G09G 2300/0408; G09G 2310/0267; G09G 2310/0286; G09G 2320/0252; G11C 19/28
See application file for complete search history.

(56) References Cited

U.S. PATENT DOCUMENTS

2019/0285930 A1* 9/2019 Chen .................... G09G 3/3677

FOREIGN PATENT DOCUMENTS

CN    106251820 A  * 12/2016 ............. G06F 3/044

* cited by examiner

Primary Examiner — Abhishek Sarma
(74) Attorney, Agent, or Firm — PV IP PC; Wei Te Chung

(57) ABSTRACT

The present application discloses a gate drive circuit and a display panel. The gate drive circuit includes a plurality of cascaded gate drive units, in which by adopting a same complex clock signal for a pull-down control module, a maintaining module and a pull-down module, a N-th-stage gate drive unit can rapidly pull down a falling edge of a N-th-stage scan signal to the potential of a constant low voltage level signal and effectively reduces the time required to pull down the N-th-stage scan signal from high voltage level to low voltage level.

19 Claims, 4 Drawing Sheets

GATE DRIVE CIRCUIT AND DISPLAY PANEL

RELATED APPLICATIONS

This application is a Notional Phase of PCT Patent Application No. PCT/CN2021/100902 having international filing date of Jun. 18, 2021, which claims the benefit of priority of Chinese Patent Application No. 202110634626.8 filed on Jun. 8, 2021. The contents of the above applications are all incorporated by reference as if fully set forth herein in their entirety.

FIELD OF THE DISCLOSURE

The present application relates to display technologies, and more particularly to a gate drive circuit and a display panel.

DESCRIPTION OF RELATED ARTS

As a display component of electronic equipments, display panels have been widely used in various electronic products. A gate drive circuit is an important part of the display device. The gate drive circuit can also be called a gate driver on array (GOA) circuit, which uses an array process of thin-film-transistor (TFT) display to realize row-by-row scan gate driving.

However, the gate drive circuit is easily to be affected by various of factors such that a longer time is needed for pulling down a failing edge of its outputted scan signal to a preset low voltage level. It is easy to deteriorate instability of the display panel.

It should be noted that the afore-described background art is only for easy of clearly and completely understanding the solutions of the present application. The solutions described above are not therefore considered to be known to a person of ordinary skill in the art, merely because they appear in the background section of the present application.

SUMMARY

Technical Problems

The present application provides a gate drive circuit and a display panel, for alleviating the technical problem of a longer time required for pulling down a failing edge of a scan signal to a preset low voltage level.

Technical Solutions

In a first aspect, the present application provides a gate drive circuit, including a plurality of cascaded gate drive units, in which a N-th-stage gate drive unit includes: a pull-down control module, a control end of the pull-down control module configured to receive a complex clock signal, an output end of the pull-down control module electrically connected to a N-th-stage node, the complex clock signal including a first clock signal; a pull-up module, the control end of the pull-up module electrically connected to the N-th-stage node, the output end of the pull-up module configured to output a N-th-stage scan signal; a pull-down module, an input end of the pull-down module configured to receive a constant low voltage level signal, the output end of the pull-down module electrically connected to the output end of the pull-up module, the control end of the pull-down module configured to receive the first clock signal; and a maintaining module, one of the input end and the output end of the maintaining module electrically connected to the N-th-stage node, the other one of the input end and the output end of the maintaining module electrically connected to the output end of the pull-up module, the control end of the maintaining module configured to receive the complex clock signal.

In some embodiments, the N-th-stage gate drive unit further includes: a pull-up control module, the input end of the pull-up control module level electrically connected to the input end of the pull-down control module, the control end of the pull-up control module electrically connected to a (N−4)-th-stage node, the output end of the pull-up control module electrically connected to the N-th-stage node. The (N−4)-th-stage node is a virtual node disposed in a (N−4)-th-stage gate drive unit and has a same structure and position as the N-th-stage node.

In some embodiments, the N-th-stage gate drive unit further includes: a first abnormal power-off control module, the input end of the first abnormal power-off control module and the control end of the first abnormal power-off control module configured to receive a first global control signal, the output end of the first abnormal power-off control module electrically connected to the output end of the pull-up module; and a second abnormal power-off control module, the input end of the second abnormal power-off control module configured to receive the constant low voltage level signal, the control end of the second abnormal power-off control module configured to receive the first global control signal, the output end of the second abnormal power-off control module electrically connected to the N-th-stage node.

In some embodiments, the N-th-stage gate drive unit further includes: a first reset module, the input end of the first reset module configured to receive the constant low voltage level signal, the control end of the first reset module configured to receive a reset signal, the output end of the first reset module electrically connected to the N-th-stage node; and a second reset module, the input end of the second reset module configured to receive the constant low voltage level signal, the control end of the second reset module configured to receive the reset signal, the output end of the second reset module electrically connected to the output end of the pull-up module.

In some embodiments, the N-th-stage gate drive unit further includes: a voltage level coupling module, one end of the voltage level coupling module is electrically connected to the control end of the pull-up module and the other end of the voltage level coupling module electrically connected to the output end of the pull-up module.

In some embodiments, the N-th-stage gate drive unit further includes: a global control module, the input end of the global control module configured to receive the constant low voltage level signal, the control end of the global control module configured to receive a second global control signal, and the output end of the global control module electrically connected to the output end of the pull-up module.

In some embodiments, the complex clock signal further includes a second clock signal, and operation cycle of the first clock signal partially overlaps with operation cycle of the second clock signal.

In a second aspect, the present application provides a gate drive circuit, including a plurality of cascaded gate drive units, in which a N-th-stage gate drive unit includes: a first thin-film transistor, a gate of the first thin-film transistor configured to receive a first clock signal, one of a source and a drain of the first thin-film transistor electrically connected to a N-th-stage node; a second thin-film transistor, one of the source and the drain of the second thin-film transistor electrically connected to the other one of the source and the drain electrode of the first thin-film transistor, the gate of the second thin-film transistors configured to receive a second clock signal; a third thin-film transistor, the gate of the third thin-film transistor electrically connected to the N-th-stage node, one of the source and the drain of the third thin-film transistor configured to output a N-th-stage scan signal; a fourth thin-film transistor, one of the source and the drain of the fourth thin-film transistor electrically connected to one of the source and the drain of the third thin-film transistor, the gate of the fourth thin-film transistor configured to receive the first clock signal; a fifth thin-film transistor, one of the source and the drain of the fifth thin-film transistor electrically connected to the other one of the source and the drain of the fourth thin-film transistor, the gate of the fifth thin-film transistor configured to receive the second clock signal, the other one of the source and the drain of the fifth thin-film transistor electrically connected to the N-th-stage node; and a sixth thin-film transistor, one of the source and the drain of the sixth thin-film transistor configured to receive a constant low voltage level signal, the gate of the sixth thin-film transistor configured to receive the first clock signal, the other one of the source and the drain of the sixth thin-film transistor electrically connected to one of the source and the drain of the third thin-film transistor.

In some embodiments, the N-th-stage gate drive unit further includes: a seventh thin-film transistor, one of the source and the drain of the seventh thin-film transistor electrically connected to one of the source and the drain of the second thin-film transistor, the gate of the seventh thin-film transistors electrically connected to a (N−4)-th-stage node, the other one of the source and the drain of the seventh thin-film transistor electrically connected to the N-th-stage node. The (N−4)-th-stage node is a virtual node disposed in a (N−4)-th-stage gate drive unit and has a same structure and position as the N-th-stage node.

In some embodiments, the N-th-stage gate drive unit further includes: an eighth thin-film transistor, the gate of the eighth thin-film transistor and one of the source and the drain of the eighth thin-film transistor configured to receive a first global control signal, the other one of the source and the drain of the eighth thin-film transistor electrically connected to one of the source and the drain of the third thin-film transistor; and a ninth thin-film transistor, one of the source and the drain of the ninth thin-film transistor configured to receive the constant low voltage level signal, the gate of the ninth thin-film transistor configured to receive the first global control signal, and the other one of the source and the drain of the ninth thin-film transistor electrically connected to the N-th-stage node.

In some embodiments, the N-th-stage gate drive unit further includes: a tenth thin-film transistor, one of the source and the drain of the tenth thin-film transistor configured to receive the constant low voltage level signal, the gate of the tenth thin-film transistor configured to receive a reset signal, the other one of the tenth thin-film transistor electrically connected to the N-th-stage node; and an eleventh thin-film transistor, one of the source and the drain of the eleventh thin-film transistor configured to receive the constant low voltage level signal, the gate of the eleventh thin-film transistor configured to receive the reset signal, the other one of the eleventh thin-film transistor electrically connected to one of the source and the drain of the third thin-film transistor.

In some embodiments, the N-th-stage gate drive unit further includes: a first capacitor, a first end of the first capacitor electrically connected to the N-th-stage node and a second end of the first capacitor electrically connected to one of the source and the drain of the third thin-film transistor.

In some embodiments, the N-th-stage gate drive unit further includes: a twelfth thin-film transistor, one of the source and the drain of the twelfth thin-film transistor configured to receive the constant low voltage level signal, the gate of the twelfth thin-film transistor configured to receive a second global control signal, and the other one of the twelfth thin-film transistor electrically connected to one of the source and the drain of the third thin-film transistor.

In some embodiments, operation cycle of the first clock signal partially overlaps with operation cycle of the second clock signal.

In a third aspect, the present application provides a display panel, including the gate drive circuit according to any of afore-described implementations.

Beneficial Effects

In the gate drive circuit and the display panel provided in the present application, by adopting a same complex clock signal for the pull-down control module, the maintaining module and the pull-down module, a falling edge of the N-th-stage scan signal can be rapidly pulled down to the potential of the constant low voltage level signal, and this effectively reduces the time required to pull down the N-th-stage scan signal from high voltage level to low voltage level. Also, all the control end of the pull-down control module, the control end of the pull-up module, the control end of the pull-down module and the control end of the maintaining module receive a clock signal or a square signal, and this can effectively improve the stress problem, caused by a same voltage level endured by the control end of each module for a long time, thereby further improving the stability of the gate drive circuit.

DESCRIPTION OF EMBODIMENTS OF THE DISCLOSURE

To make the objectives, technical schemes, and effects of the present application more clear and specific, the present application is described in further detail below with reference to the embodiments in accompanying with the appending drawings. It should be understood that the specific embodiments described herein are merely for interpreting the present application and the present application is not limited thereto.

Figure 1:
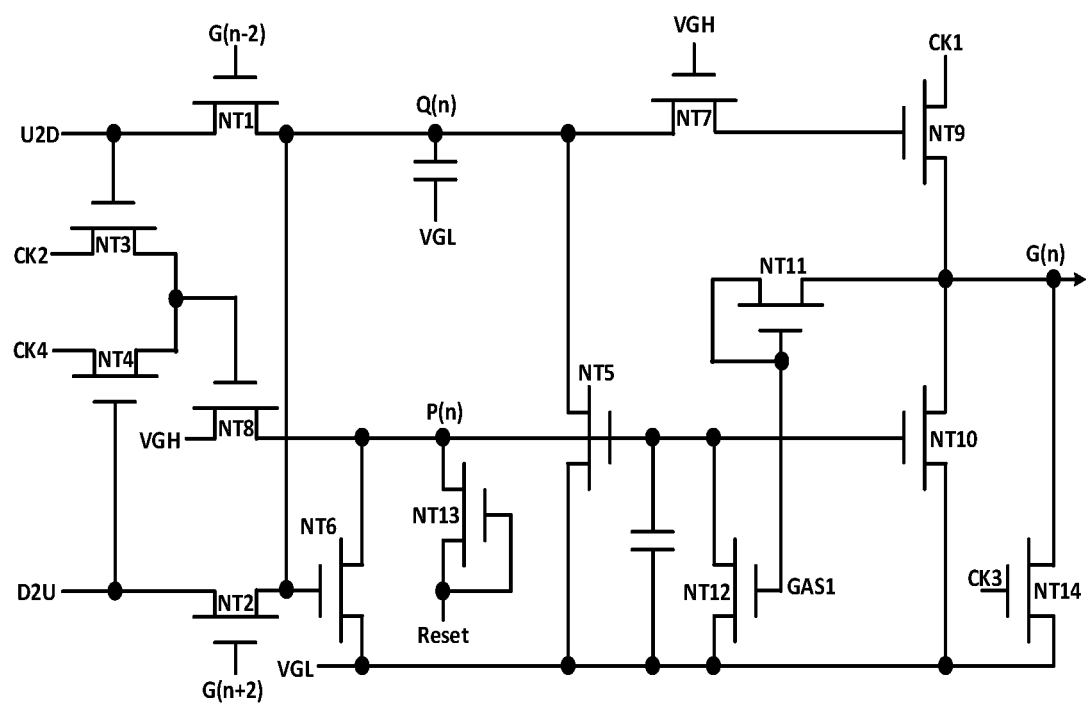
FIG. 1 is a schematic diagram showing the structure of a gate drive circuit provided in an embodiment of the present application.

Please refer to FIG. 1 to. As shown in FIG. 1, the present embodiment provides a gate drive circuit, which includes a transistor NT1, a transistor NT2, a transistor NT3, a transistor NT4, a transistor NT5, a transistor NT6, a transistor NT7, a transistor NT8, a transistor NT9, a transistor NT10, a transistor NT11, a transistor NT12, a transistor NT13, a transistor NT14 and two capacitors.

One of the source and the drain of the transistor NT1 and the gate of the transistor NT3 are configured to receive a forward scan control signal U2D. The gate of the transistor NT1 is configured to receive a (n−2)-th-stage scan signal G(n−2). The other one of the source and the drain of the transistor NT1 is connected to a node Q(n). The gate of the transistor NT7 and one of the source and the drain of the transistor NT8 are configured to receive a constant high voltage level signal VGH. One of the source and the drain of the transistor NT9 is configured to receive a clock signal CK1 and the other one of the source and the drain of the transistor NT9 is configured to output a n-th-stage scan signal G(n). One of the source and the drain of the transistor NT3 is configured to receive a clock signal CK2. One of the source and the drain of the transistor NT4 is configured to receive a clock signal CK4. One of the source and the drain of the transistor NT2 is configured to receive a backward scan control signal D2U, and the gate of the transistor NT2 is configured to receive a (n+2)-th-stage scan signal G(n+2). One of the source and the drain of the transistor NT13 and the gate of the transistor NT13 are configured to receive a reset signal Reset. The gate of the transistor NT12, the gate of the transistor NT11 and one of the source and the drain of the transistor NT11 are configured to receive a control signal GAS1. The gate of the transistor NT14 is configured to receive a clock signal CK3. One end of the two capacitors, one of the source and the drain of the transistor NT6, one of the source and the drain of the transistor NT5, one of the source and the drain of the transistor NT12, one of the source and the drain of the transistor NT10 and one of the source and the drain of the transistor NT14 are configured to receive a constant low voltage level signal VGL. A node P(n) needs to keep at a low-voltage-level state for a long time. It is easy to cause the gate of the transistor NT5 and the gate of the transistor NT10 to maintain at a same voltage level for a long time. This will cause the stress endured by the transistor NT5 and the transistor NT10 to be deteriorated constantly, thereby reducing their service life. This will also reduce the stability of the gate drive circuit.

Figure 2:
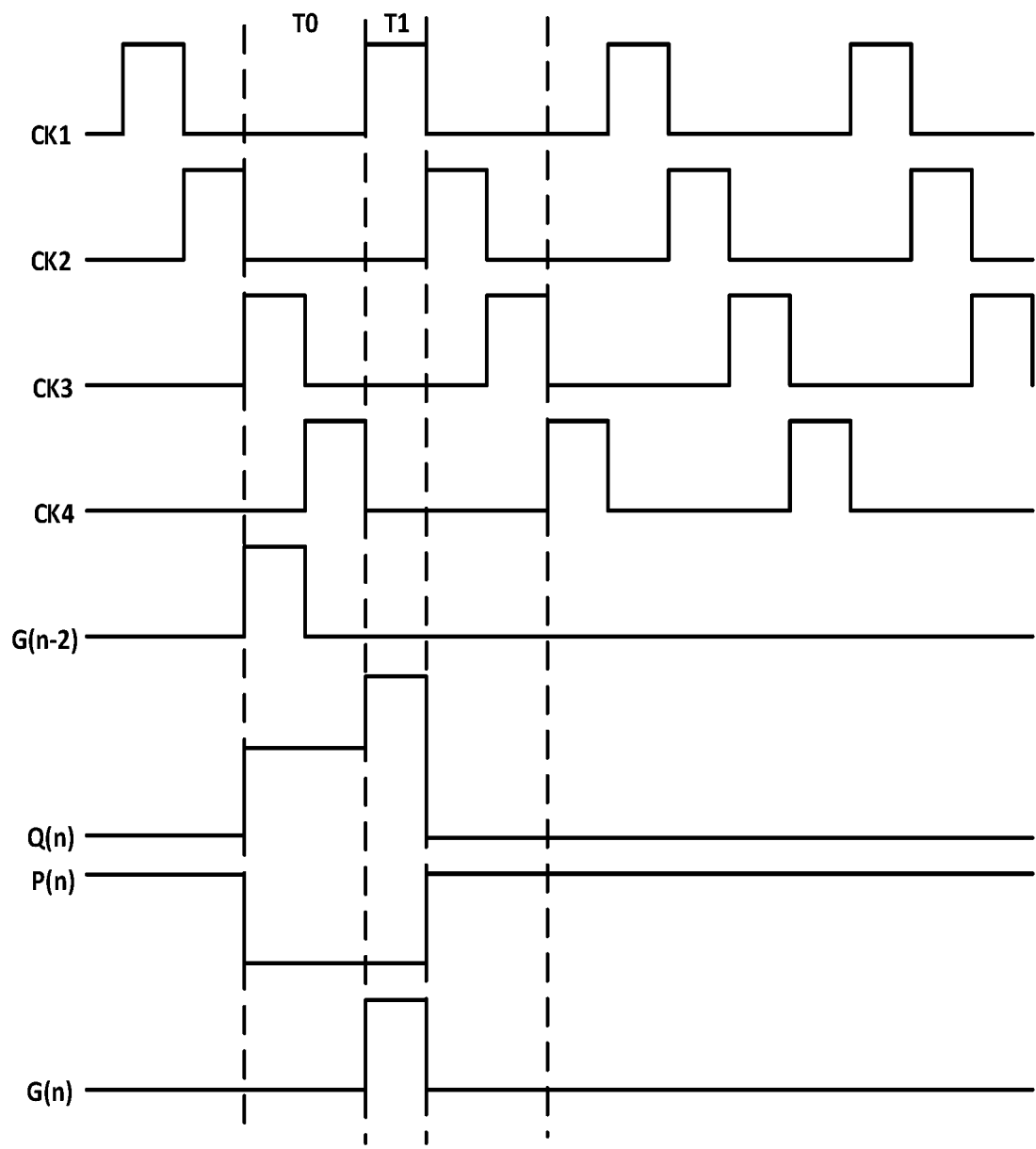
FIG. 2 is a timing diagram of the gate drive circuit shown in FIG. 1.

In view of above descriptions, as shown in FIG. 2, in the time period T0, both the clock signal CK1 and the clock signal CK2 are located at a low-voltage-level state, and the clock signal CK3 and the clock signal CK4 jumps to a high-voltage-level state in turn. When the (n−2)-th-stage scan signal G(n−2) jumps to high voltage level, the potential of the node Q(n) also jumps to higher voltage level; however, the potential of the node P(n) jumps to low voltage level and the n-th-stage scan signal G(n) keeps at a low-voltage-level state.

In the time period T1, the clock signal CK1 jumps to high voltage level and the node Q(n) is coupled to have higher voltage level; however, the potential of the node P(n) still keeps at low voltage level. Meanwhile, the outputted high-voltage-level pulse of the clock signal CK1 is the high-voltage-level pulse of the n-th-stage scan signal G(n).

Figure 3:
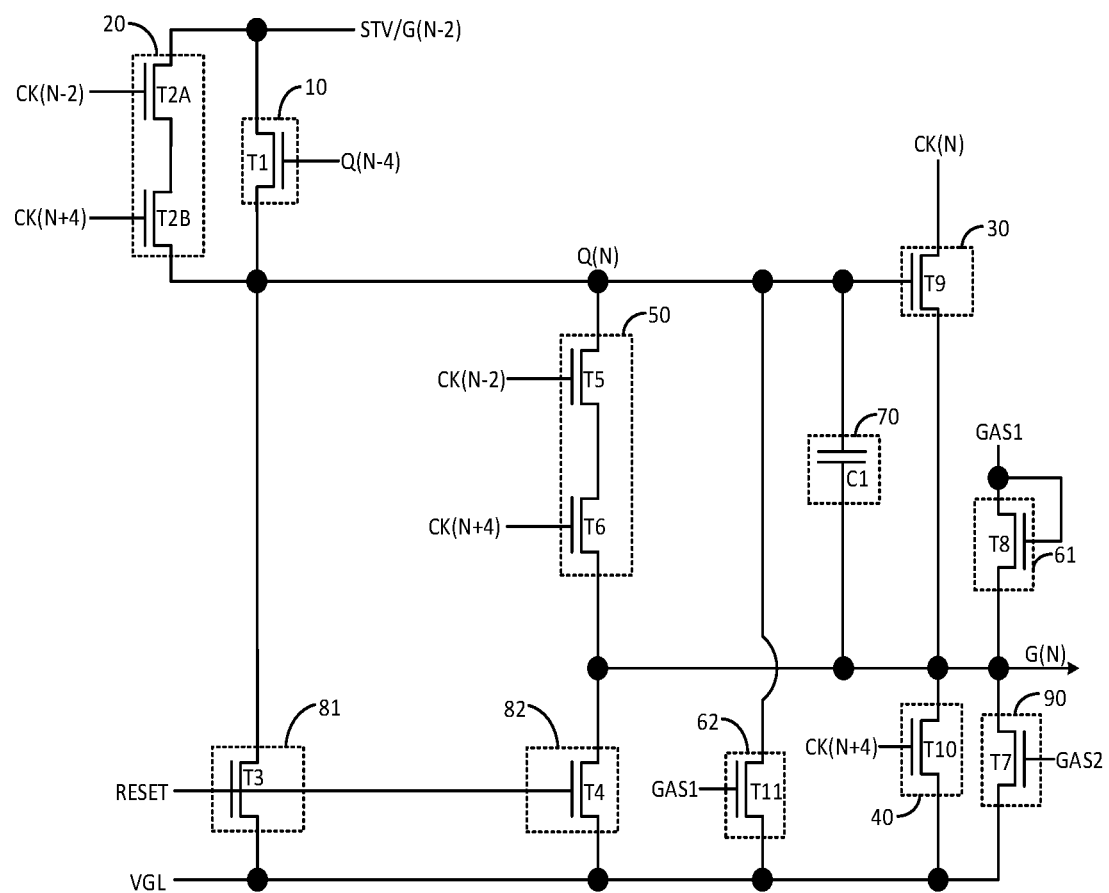
FIG. 3 is a schematic diagram showing another structure of a gate drive circuit provided in an embodiment of the present application.
Figure 4:
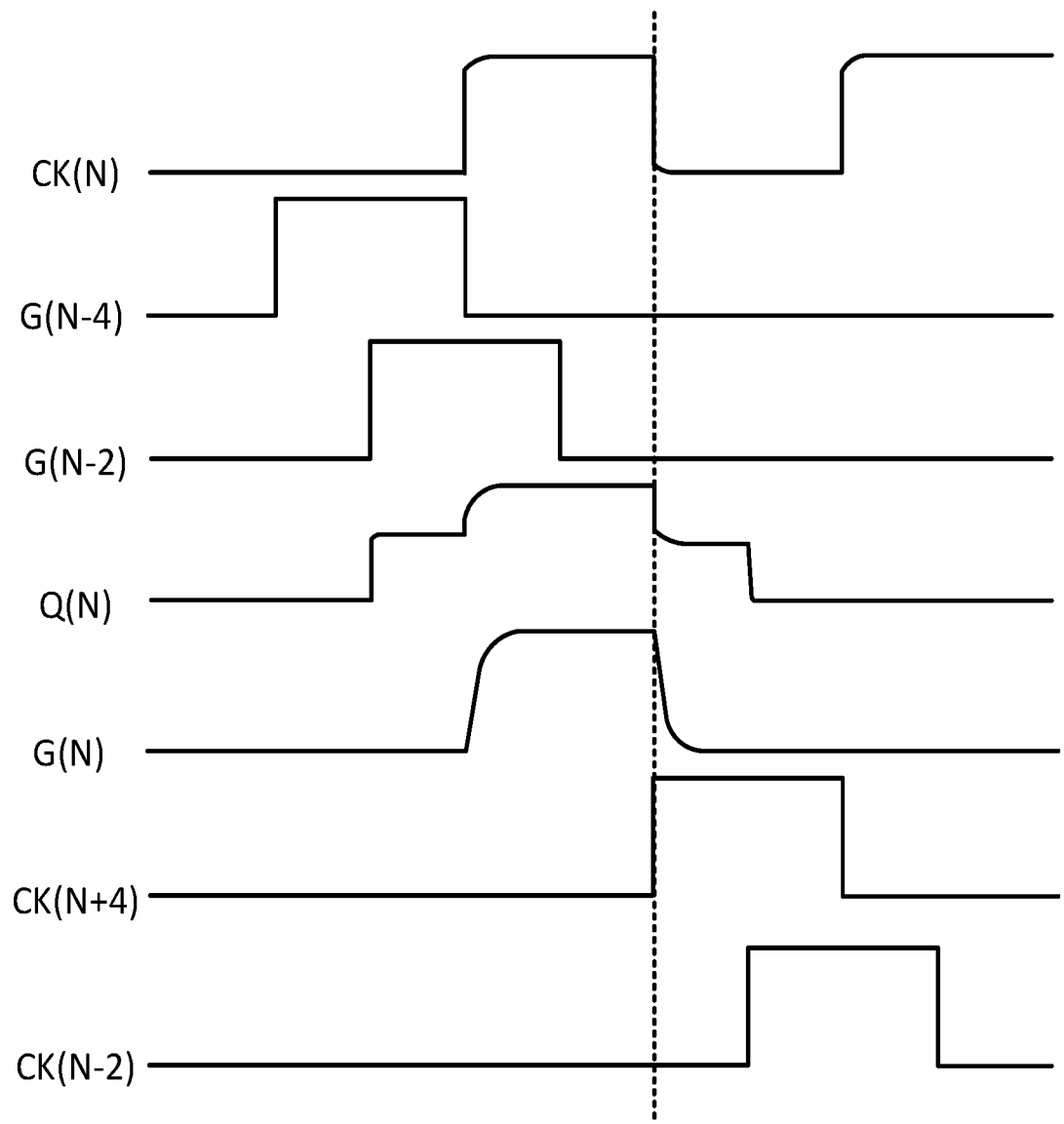
FIG. 4 is a timing diagram of the gate drive circuit shown in FIG. 3.

Please refer to FIGS. 3 to 4. As shown in FIG. 3, the present embodiment provides another gate drive circuit. The gate drive circuit includes a plurality of cascaded gate drive units, wherein a N-th-stage gate drive unit includes a pull-down control module 20, a pull-up module 30, a pull-down module 40 and a maintaining module 50; a control end of the pull-down control module 20 is configured to receive a complex clock signal, an output end of the pull-down control module 20 is electrically connected to a N-th-stage node Q(N), the complex clock signal includes a first clock signal; the control end of the pull-up module 30 is electrically connected to the N-th-stage node Q(N), the output end of the pull-up module 30 is configured to output a N-th-stage scan signal G(N); an input end of the pull-down module 40 is configured to receive a constant low voltage level signal VGL, the output end of the pull-down module 40 is electrically connected to the output end of the pull-up module 30, the control end of the pull-down module 40 is configured to receive the first clock signal; one of the input end and the output end of the maintaining module 50 is electrically connected to the N-th-stage node Q(N), the other one of the input end and the output end of the maintaining module 50 is electrically connected to the output end of the pull-up module 30, the control end of the maintaining module 50 is configured to receive the complex clock signal.

It can be understood that in the gate drive circuit provided in the present embodiment, by adopting a same complex clock signal for the pull-down control module 20, the maintaining module 50 and the pull-down module 40, a falling edge of the N-th-stage scan signal G(N) can be rapidly pulled down to the potential of the constant low voltage level signal VGL, and this effectively reduces the time required to pull down the N-th-stage scan signal G(N) from high voltage level to low voltage level. Also, all the control end of the pull-down control module 20, the control end of the pull-up module 30, the control end of the pull-down module 40 and the control end of the maintaining module 50 receive a clock signal or a square signal, and this can effectively improve the stress problem, caused by a same voltage level endured by the control end of each module for a long time, thereby further improving the stability of the gate drive circuit.

In one embodiment, the pull-down control module 20 may include a first thin-film transistor T2B and a second thin-film transistor T2A; the gate of the first thin-film transistor T2B is configured to receive a first clock signal, one of the source and the drain of the first thin-film transistor T2B is electrically connected to the N-th-stage node Q(N); one of the source and the drain of the second thin-film transistor T2A is electrically connected to the other one of the source and the drain electrode of the first thin-film transistor T2B, the gate of the second thin-film transistors T2A is configured to receive a second clock signal.

The first clock signal can be a (N+4)-th clock signal CK (N+4). The second clock signal can be a (N−2)-th clock signal CK (N−2).

In one embodiment, N can be a positive integer.

In one embodiment, the pull-up module 30 may include a third thin-film transistor T9, the gate of the third thin-film transistor T9 is electrically connected to the N-th-stage node Q(N), and one of the source and the drain of the third thin-film transistor T9 is configured to output the N-th-stage scan signal G(N).

In one embodiment, the input end of the pull-up module 30 is configured to receive a N-th clock signal CK(N), or the other one of the source and the drain of the third thin-film transistor T9 is configured to receive the N-th clock signal CK(N).

In one embodiment, the maintaining module 50 may include a fourth thin-film transistor T6 and a fifth thin-film transistor T5, one of the source and the drain of the fourth thin-film transistor T6 is electrically connected to one of the source and the drain of the third thin-film transistor T5, the gate of the fourth thin-film transistor T6 is configured to receive the first clock signal; one of the source and the drain of the fifth thin-film transistor T5 is electrically connected to the other one of the source and the drain of the fourth thin-film transistor T6, the gate of the fifth thin-film transistor T5 is configured to receive the second clock signal, the other one of the source and the drain of the fifth thin-film transistor T5 is electrically connected to the N-th-stage node Q(N).

It needs to be noted that when the N-th-stage scan signal G(N) is at low voltage level, the fourth thin-film transistor T6 and the fifth thin-film transistor T5 are switched off and this can keep the potential of the N-th-stage node Q(N) more stable at low voltage level. It is beneficial for improving the stability of the gate drive circuit.

In one embodiment, the pull-down module 40 may include a sixth thin-film transistor T10, one of the source and the drain of the sixth thin-film transistor T10 is configured to receive the constant low voltage level signal VGL, the gate of the sixth thin-film transistor T10 is configured to receive the first clock signal, the other one of the source and the drain of the sixth thin-film transistor T10 is electrically connected to one of the source and the drain of the third thin-film transistor T9.

In one embodiment, the N-th-stage gate drive unit further includes a pull-up control module 10. The input end of the pull-up control module 10 is electrically connected to the input end of the pull-down control module 20. The control end of the pull-up control module 10 is electrically connected to a (N−4)-th-stage node Q(N−4). The output end of the pull-up control module 10 is electrically connected to the N-th-stage node Q(N). The (N−4)-th-stage node Q(N−4) is a virtual node disposed in a (N−4)-th-stage gate drive unit and has a same structure and position as the N-th-stage node Q(N).

In one embodiment, the pull-up control module 10 may include a seventh thin-film transistor T1, one of the source and the drain of the seventh thin-film transistor T1 is electrically connected to one of the source and the drain of the second thin-film transistor T2A, the gate of the seventh thin-film transistors T1 is electrically connected to the (N−4)-th-stage node Q(N−4), the other one of the source and the drain of the seventh thin-film transistor T1 is electrically connected to the N-th-stage node Q(N). The (N−4)-th-stage node Q(N−4) is a virtual node disposed in a (N−4)-th-stage gate drive unit and has a same structure and position as the N-th-stage node Q(N).

In one embodiment, the input end of the pull-up control module 10 or one of the source and the drain of the seventh thin-film transistor T1 is configured to receive a first control signal. The first control signal may be, but is not limited to, a start signal STV, and may also be a (N−2)-th-stage scan signal G(N−2). It needs to be noted that when (N−2) is less than or equal to zero, the input end of the pull-up module 30 is configured to receive the start signal STV.

It needs to be noted that since the gate of the seventh thin-film transistor T1 receives a voltage level signal of the (N−4)-th-stage node Q(N−4), the gate drive circuit can save thin-film transistors used for generate stage transmission signals. It is beneficial for reducing the number of used thin-film transistors in the gate drive circuit.

In one embodiment, the N-th-stage gate drive unit further includes a first abnormal power-off control module 61 and a second abnormal power-off control module 62; the input end of the first abnormal power-off control module 61 and the control end of the first abnormal power-off control module 61 are configured to receive a first global control signal GAS1, the output end of the first abnormal power-off control module 61 is electrically connected to the output end of the pull-up module 30; the input end of the second abnormal power-off control module 62 is configured to receive the constant low voltage level signal VGL, the control end of the second abnormal power-off control module 62 is configured to receive a first global control signal GAS1, the output end of the second abnormal power-off control module 62 is electrically connected to the N-th-stage node Q(N).

In one embodiment, the first abnormal power-off control module 61 may include an eighth thin-film transistor T8, the gate of the eighth thin-film transistor T8 and one of the source and the drain of the eighth thin-film transistor T8 are configured to receive the first global control signal GAS1, and the other one of the source and the drain of the eighth thin-film transistor T8 is electrically connected to one of the source and the drain of the third thin-film transistor T9.

In one embodiment, the second abnormal power-off control module 62 may include a ninth thin-film transistor T11, one of the source and the drain of the ninth thin-film transistor T11 is configured to receive the constant low voltage level signal VGL, the gate of the ninth thin-film transistor T11 is configured to receive the first global control signal GAS1, and the other one of the source and the drain of the ninth thin-film transistor T11 is electrically connected to the N-th-stage node Q(N).

It needs to be noted that during abnormal power off (APO), the first global control signal GAS1 jumps from low voltage level to high voltage level. It can use the ninth thin-film transistor T11 to pull down the potential of the N-th-stage node Q(N) to switch off the third thin-film transistor T9, and at the same time use the eighth thin-film transistor T8 to pull up the potential of the N-th-stage scan signal G(N). This can improve or avoid the appearance of ghost images.

In one embodiment, the N-th-stage gate drive unit further includes a first reset module 81 and a second reset module 82. The input end of the first reset module 81 is configured to receive the constant low voltage level signal VGL, the control end of the first reset module 81 is configured to receive a reset signal RESET, the output end of the first reset module 81 is electrically connected to the N-th-stage node Q(N). The input end of the second reset module 82 is configured to receive the constant low voltage level signal VGL, the control end of the second reset module 82 is configured to receive the reset signal RESET, the output end of the second reset module 82 is electrically connected to the output end of the pull-up module 30.

In one embodiment, the first reset module 81 may include a tenth thin-film transistor T3, one of the source and the drain of the tenth thin-film transistor T3 is configured to receive the constant low voltage level signal VGL, the gate of the tenth thin-film transistor T3 is configured to receive the reset signal RESET, and the other one of the tenth thin-film transistor T3 is electrically connected to the N-th-stage node Q(N).

In one embodiment, the second reset module 82 may include an eleventh thin-film transistor T4, one of the source and the drain of the eleventh thin-film transistor T4 is configured to receive the constant low voltage level signal VGL, the gate of the eleventh thin-film transistor T4 is configured to receive the reset signal RESET, and the other one of the eleventh thin-film transistor T4 is electrically connected to one of the source and the drain of the third thin-film transistor T9.

It needs to be noted that at the beginning of each frame, it can use the tenth thin-film transistor T3 to reset the potential of the N-th-stage node Q(N) to the constant low voltage level, and this can increase the stability of the gate drive circuit and prevent it from being malfunctioned; meanwhile, it can use the eleventh thin-film transistor T4 to reset the potential of the N-th-stage scan signal G(N) to the constant low voltage level, and likewise, this can further increase the stability of the gate drive circuit and prevent it from being malfunctioned.

In one embodiment, the N-th-stage gate drive unit further includes a voltage level coupling module 70, one end of the voltage level coupling module 70 is electrically connected to the control end of the pull-up module 30 and the other end of the voltage level coupling module 70 is electrically connected to the output end of the pull-up module 30.

In one embodiment, the voltage level coupling module 70 may include a first capacitor C1, a first end of the first capacitor C1 is electrically connected to the N-th-stage node Q(N) and a second end of the first capacitor C1 is electrically connected to one of the source and the drain of the third thin-film transistor T9.

It needs to be noted that when the potential of the N-th-stage node Q(N) is a higher voltage level, the first capacitor C1 can make the potential of the N-th-stage node Q(N) be a higher voltage level by coupling such that the third thin-film transistor T9 is switched on completely and the N-th clock signal CK(N) is transmitted losslessly.

In one embodiment, the N-th-stage gate drive unit further includes a global control module 90, the input end of the global control module 90 is configured to receive the constant low voltage level signal VGL, the control end of the global control module 90 is configured to receive a second global control signal GAS2, and the output end of the global control module 90 is electrically connected to the output end of the pull-up module 30.

In one embodiment, the global control module 90 may include a twelfth thin-film transistor T7, one of the source and the drain of the twelfth thin-film transistor T7 is configured to receive the constant low voltage level signal VGL, the gate of the twelfth thin-film transistor T7 is configured to receive the second global control signal GAS2, and the other one of the twelfth thin-film transistor T7 is electrically connected to one of the source and the drain of the third thin-film transistor T9.

It needs to be noted that when there is a need to perform touch control operations, the second global control signal GAS2 jumps from low voltage level to high voltage level to switch on the twelfth thin-film transistor T7. This can pull down all the potential of scan signals to constant low voltage level to stop the displaying.

In one embodiment, the complex clock signal further includes a second clock signal. The operation cycle of the first clock signal partially overlaps with the operation cycle of the second clock signal.

It needs to be noted that the high potential of the first clock signal may partially overlap with the high potential of the second clock signal in terms of time. In such a way, it may use the first clock signal alone, it may also use the second clock signal alone, and further, it may use a combination of the first clock signal and the second clock signal. Compared to a certain clock signal that can only be used alone, this can save a clock signal and a corresponding clock signal line.

In view of above embodiments, it can be understood that the circuit topology of the gate drive circuit provided in the present application is relatively simple, and the number of components employed is small. This is beneficial for reducing manufacture cost and for implementing a narrow bezel of the display panel.

In one embodiment, at least one of the first thin-film transistor T2B, the second thin-film transistor T2A, the third thin-film transistor T9, the fourth thin-film transistor T6, the fifth thin-film transistor T5, the sixth thin-film transistor T10, the seventh thin-film transistor T1, the eighth thin-film transistor T8, the ninth thin-film transistor T11, the tenth thin-film transistor T3, the eleventh thin-film transistor T4 or the twelfth thin-film transistor T7 can be a N-type thin-film transistor. It needs to be noted that the type of the thin-film transistors can be a NMOS type, a PMOS type or a combination of NMOS and PMOS. Correspondingly, the GOA circuit can be a NMOS circuit, a PMOS circuit and a CMOS circuit. Compared to the CMOS circuit, the NMOS circuit is of great benefit in improving the product yield and reducing the cost for the NMOS circuit can save processes, and therefore there is a realistic industrial demand for developing a stable NMOS circuit.

In one embodiment, at least one of the first thin-film transistor T2B, the second thin-film transistor T2A, the third thin-film transistor T9, the fourth thin-film transistor T6, the fifth thin-film transistor T5, the sixth thin-film transistor T10, the seventh thin-film transistor T1, the eighth thin-film transistor T8, the ninth thin-film transistor T11, the tenth thin-film transistor T3, the eleventh thin-film transistor T4 or the twelfth thin-film transistor T7 can be at least one of a low-temperature polysilicon thin-film transistor, an indium gallium zinc oxide (IGZO) thin-film transistor or an amorphous silicon thin-film transistor.

The carriers of the NMOS thin-film transistor are electrons with high mobility, and its corresponding device is easily to be damaged as compared to PMOS (its carriers are holes). Therefore, the stability of devices manufactured with low-temperature polysilicon thin-film transistors, indium gallium zinc oxide thin-film transistors and amorphous silicon thin-film transistors decreases in order.

In order to ensure normal image displaying, if the gate of each thin-film transistor in the gate drive circuit keeps at high voltage level for a long time, it will cause the stress endured by corresponding thin-film transistors to be deteriorated and damage the corresponding thin-film transistors. This is particularly true for indium gallium zinc oxide thin-film transistors and amorphous silicon thin-film transistors. Correspondingly, the display panel will have an insufficient high-temperature reliability problem, and it is easy to occur invalid GOA current, split screen, abnormal screen, etc.

In view of this, the present embodiment provides another gate drive circuit. The gate drive circuit includes a plurality of cascaded gate drive units, wherein a N-th-stage gate drive unit includes a first thin-film transistor T2B, a second thin-film transistor T2A, a third thin-film transistor T9, a fourth thin-film transistor T6, a fifth thin-film transistor T5 and a sixth transistor T10; the gate of the first thin-film transistor T2B is configured to receive a first clock signal, one of the source and the drain of the first thin-film transistor T2B is electrically connected a N-th-stage node Q(N); one of the source and the drain of the second thin-film transistor T2A is electrically connected to the other one of the source and the drain of the first thin-film transistor T2B, the gate of the second thin-film transistor T2A is configured to receive a second clock signal; the gate of the third thin-film transistor T9 is electrically connected to the N-th-stage node Q(N), one of the source and the drain of the third thin-film transistor T9 is configured to output a N-th-stage scan signal G(N); one of the source and the drain of the fourth thin-film transistor T6 is electrically connected to one of the source and the drain of the third thin-film transistor T9, the gate of the fourth thin-film transistor T6 is configured to receive the first clock signal; one of the source and the drain of the fifth thin-film transistor T5 is electrically connected to the other one of the source and the drain of the fourth thin-film transistor T6, the gate of the fifth thin-film transistor T5 is configured to receive the second clock signal, the other one of the source and the drain of the fifth thin-film transistor T5 is electrically connected to the N-th-stage node Q(N); one of the source and the drain of the sixth thin-film transistor T10 is configured to receive a constant low voltage level signal VGL, the gate of the sixth thin-film transistor T10 is configured to receive the first clock signal, the other one of the source and the drain of the sixth thin-film transistor T10 is electrically connected to one of the source and the drain of the third thin-film transistor T9.

It can be understood that in the gate drive circuit provided in the present embodiment, the first clock signal is shared by the gate of the first thin-film transistor T2B, the gate of the fourth thin-film transistor T6 and the gate of the sixth thin-film transistor T10, and the second clock signal is shared by the gate of the second thin-film transistor T2A and the gate of the fifth thin-film transistor T5. In such a way, a falling edge of the N-th-stage scan signal G(N) can be rapidly pulled down to the potential of the constant low voltage level signal VGL, and this effectively reduces the time required to pull down the N-th-stage scan signal G(N) from high voltage level to low voltage level. Also, all the gates of the first thin-film transistor T2B to the sixth thin-film transistor T10 receive a clock signal or a square signal, and this can effectively improve the stress problem, caused by a same voltage level endured by the gate of each thin-film transistor for a long time, thereby further improving the stability of the gate drive circuit and extending the service life of the thin-film transistors.

In view of above descriptions, as shown in FIG. 4, work processes of the gate drive circuit provided in the present application are described below.

When the (N−2)-th-stage scan signal G(N−2) jumps from low voltage level to high voltage level, the seventh thin-film transistor T1 is switched on, and the potential of the N-th-stage node Q(N) jumps to a higher voltage level; when the N-th clock signal CK(N) jumps to high voltage level, the potential of the N-th-stage node Q(N) jumps to a much higher voltage level by coupling and at this moment, the N-th clock signal CK(N) is outputted as the N-th-stage scan signal G(N); when the (N+4)-th clock signal jumps to high voltage level, the sixth thin-film transistor T10 is switched on and starts to pull down the potential of the N-th-stage scan signal G(N); then, the (N−2)-th clock signal also jumps to high voltage level, meanwhile, the first thin-film transistor T2B, the second thin-film transistor T2A, the fourth thin-film transistor T6, the fifth thin-film transistor T5 and the sixth thin-film transistor T10 are switched on simultaneously. They can together pull down the potential of the N-th-stage node Q(N) and the potential of the N-th-stage scan signal G(N) such that it is accelerated to pull down the potential of the N-th-stage scan signal G(N) to the constant low voltage level. In such a way, the time required to pull down the N-th-stage scan signal G(N) from high voltage level to low voltage-level signal is reduced to 0.9 microsecond or so.

The rising edge of the (N−4)-th-stage scan signal G(N−4) is prior to the rising edge of the (N−2)-th-stage scan signal G(N−2), and the time duration of the high voltage level of the (N−4)-th-stage scan signal G(N−4) partially overlaps with the time duration of the high voltage level of the (N−2)-th-stage scan signal G(N−2).

In one embodiment, the present embodiment provides a display panel including the gate drive circuit according to any of the afore-described embodiments.

It can be understood that in the display panel provided in the present embodiment, by adopting a same complex clock signal for the pull-down control module 20, the maintaining module 50 and the pull-down module 40, a falling edge of the N-th-stage scan signal G(N) can be rapidly pulled down to the potential of the constant low voltage level signal VGL, and this effectively reduces the time required to pull down the N-th-stage scan signal G(N) from high voltage level to low voltage level. Also, all the control end of the pull-down control module 20, the control end of the pull-up module 30, the control end of the pull-down module 40 and the control end of the maintaining module 50 receive a clock signal or a square signal, and this can effectively improve the stress problem, caused by a same voltage level endured by the control end of each module for a long time, thereby further improving the stability of the gate drive circuit.

In one embodiment, the display panel includes a first non-display region and a second non-display region, wherein odd-stage gate drive units are located in the first non-display region, and even-stage gate drive units are located in the second non-display region.

The odd-stage gate drive units can be N-th-stage gate drive units, where N is an odd number. The even-stage gate drive units can be N-th-stage gate drive units, where N is an even number.

In one embodiment, the display panel includes a plurality of clock signal lines, and the plurality of clock signal lines are electrically connected to the gate drive circuit, wherein four or eight clock signal lines are disposed on each of the first non-display region and the second non-display region.

When there are four clock signal lines disposed on each of the first non-display region and the second non-display region, four continuous odd-state or even-stage gate drive units may be taken as a cycle to repeatedly use corresponding fourth clock signal lines.

When there are eight clock signal lines disposed on each of the first non-display region and the second non-display region, four continuous odd-state or even-stage gate drive units may be taken as a cycle at an interval of four gate drive units to repeatedly use corresponding eight clock signal lines.

It should be understood that those of ordinary skill in the art may make equivalent modifications or variations according to the technical schemes and invention concepts of the present application, but all such modifications and variations should be within the appended claims of the present application.

The invention claimed is:

1. A gate drive circuit, comprising a plurality of cascaded gate drive units, in which a N-th-stage gate drive unit comprises:
   a pull-down control module, a control end of the pull-down control module configured to receive a complex clock signal, an output end of the pull-down control module electrically connected to a N-th-stage node, the complex clock signal comprising a first clock signal;
   a pull-up module, the control end of the pull-up module electrically connected to the N-th-stage node, the output end of the pull-up module configured to output a N-th-stage scan signal;
   a pull-down module, an input end of the pull-down module configured to receive a constant low voltage level signal, the output end of the pull-down module electrically connected to the output end of the pull-up module, the control end of the pull-down module configured to receive the first clock signal; and a maintaining module, one of the input end and the output end of the maintaining module electrically connected to the N-th-stage node, the other one of the input end and the output end of the maintaining module electrically connected to the output end of the pull-up module, the control end of the maintaining module configured to receive the complex clock signal, wherein the N-th-stage gate drive unit further comprises:
a pull-up control module, the input end of the pull-up control module level electrically connected to the input end of the pull-down control module, the control end of the pull-up control module electrically connected to a (N−4)-th-stage node, the output end of the pull-up control module electrically connected to the N-th-stage node.

2. The gate drive unit of claim 1, wherein the N-th-stage gate drive unit further comprises:
a first abnormal power-off control module, the input end of the first abnormal power-off control module and the control end of the first abnormal power-off control module configured to receive a first global control signal, the output end of the first abnormal power-off control module electrically connected to the output end of the pull-up module; and
a second abnormal power-off control module, the input end of the second abnormal power-off control module configured to receive the constant low voltage level signal, the control end of the second abnormal power-off control module configured to receive the first global control signal, the output end of the second abnormal power-off control module electrically connected to the N-th-stage node.

3. The gate drive unit of claim 1, wherein the N-th-stage gate drive unit further comprises:
a first reset module, the input end of the first reset module configured to receive the constant low voltage level signal, the control end of the first reset module configured to receive a reset signal, the output end of the first reset module electrically connected to the N-th-stage node; and
a second reset module, the input end of the second reset module configured to receive the constant low voltage level signal, the control end of the second reset module configured to receive the reset signal, the output end of the second reset module electrically connected to the output end of the pull-up module.

4. The gate drive unit of claim 1, wherein the N-th-stage gate drive unit further comprises:
a voltage level coupling module, one end of the voltage level coupling module is electrically connected to the control end of the pull-up module and the other end of the voltage level coupling module electrically connected to the output end of the pull-up module.

5. The gate drive unit of claim 4, wherein the N-th-stage gate drive unit further comprises:
a global control module, the input end of the global control module configured to receive the constant low voltage level signal, the control end of the global control module configured to receive a second global control signal, and the output end of the global control module electrically connected to the output end of the pull-up module.

6. The gate drive circuit of claim 1, wherein the complex clock signal further comprises a second clock signal, and operation cycle of the first clock signal partially overlaps with operation cycle of the second clock signal.

7. The gate drive circuit of claim 1, wherein the pull-down control module comprises:
a first thin-film transistor, a gate of the first thin-film transistor configured to receive the first clock signal, one of a source and a drain of the first thin-film transistor electrically connected to the N-th-stage node; and
a second thin-film transistor, one of the source and the drain of the second thin-film transistor electrically connected to the other one of the source and the drain electrode of the first thin-film transistor, the gate of the second thin-film transistors configured to receive a second clock signal.

8. The gate drive circuit of claim 7, wherein the pull-up module comprises:
a third thin-film transistor, the gate of the third thin-film transistor electrically connected to the N-th-stage node, one of the source and the drain of the third thin-film transistor configured to output the N-th-stage scan signal.

9. The gate drive circuit of claim 8, wherein the maintaining module comprises:
a fourth thin-film transistor, one of the source and the drain of the fourth thin-film transistor electrically connected to one of the source and the drain of the third thin-film transistor, the gate of the fourth thin-film transistor configured to receive the first clock signal; and
a fifth thin-film transistor, one of the source and the drain of the fifth thin-film transistor electrically connected to the other one of the source and the drain of the fourth thin-film transistor, the gate of the fifth thin-film transistor configured to receive the second clock signal, the other one of the source and the drain of the fifth thin-film transistor electrically connected to the N-th-stage node.

10. The gate drive circuit of claim 9, wherein the pull-down module comprises:
a sixth thin-film transistor, one of the source and the drain of the sixth thin-film transistor configured to receive the constant low voltage level signal, the gate of the sixth thin-film transistor configured to receive the first clock signal, the other one of the source and the drain of the sixth thin-film transistor electrically connected to one of the source and the drain of the third thin-film transistor.

11. The gate drive circuit of claim 10, wherein the pull-up module comprises:
a seventh thin-film transistor, one of the source and the drain of the seventh thin-film transistor electrically connected to one of the source and the drain of the second thin-film transistor, the gate of the seventh thin-film transistors electrically connected to a (N−4)-th-stage node, the other one of the source and the drain of the seventh thin-film transistor electrically connected to the N-th-stage node.

12. A display panel, comprising the gate drive circuit according to claim 1.

13. A gate drive circuit, comprising a plurality of cascaded gate drive units, in which a N-th-stage gate drive unit comprises:
a first thin-film transistor, a gate of the first thin-film transistor configured to receive a first clock signal, one of a source and a drain of the first thin-film transistor electrically connected to a N-th-stage node;

a second thin-film transistor, one of the source and the drain of the second thin-film transistor electrically connected to the other one of the source and the drain electrode of the first thin-film transistor, the gate of the second thin-film transistors configured to receive a second clock signal;

a third thin-film transistor, the gate of the third thin-film transistor electrically connected to the N-th-stage node, one of the source and the drain of the third thin-film transistor configured to output a N-th-stage scan signal;

a fourth thin-film transistor, one of the source and the drain of the fourth thin-film transistor electrically connected to one of the source and the drain of the third thin-film transistor, the gate of the fourth thin-film transistor configured to receive the first clock signal;

a fifth thin-film transistor, one of the source and the drain of the fifth thin-film transistor electrically connected to the other one of the source and the drain of the fourth thin-film transistor, the gate of the fifth thin-film transistor configured to receive the second clock signal, the other one of the source and the drain of the fifth thin-film transistor electrically connected to the N-th-stage node; and a sixth thin-film transistor, one of the source and the drain of the sixth thin-film transistor configured to receive a constant low voltage level signal, the gate of the sixth thin-film transistor configured to receive the first clock signal, the other one of the source and the drain of the sixth thin-film transistor electrically connected to one of the source and the drain of the third thin-film transistor.

14. The gate drive unit of claim 13, wherein the N-th-stage gate drive unit further comprises:
a seventh thin-film transistor, one of the source and the drain of the seventh thin-film transistor electrically connected to one of the source and the drain of the second thin-film transistor, the gate of the seventh thin-film transistors electrically connected to a (N−4)-th-stage node, the other one of the source and the drain of the seventh thin-film transistor electrically connected to the N-th-stage node.

15. The gate drive unit of claim 13, wherein the N-th-stage gate drive unit further comprises:
an eighth thin-film transistor, the gate of the eighth thin-film transistor and one of the source and the drain of the eighth thin-film transistor configured to receive a first global control signal, the other one of the source and the drain of the eighth thin-film transistor electrically connected to one of the source and the drain of the third thin-film transistor; and a ninth thin-film transistor, one of the source and the drain of the ninth thin-film transistor configured to receive the constant low voltage level signal, the gate of the ninth thin-film transistor configured to receive the first global control signal, and the other one of the source and the drain of the ninth thin-film transistor electrically connected to the N-th-stage node.

16. The gate drive unit of claim 13, wherein the N-th-stage gate drive unit further comprises:
a tenth thin-film transistor, one of the source and the drain of the tenth thin-film transistor configured to receive the constant low voltage level signal, the gate of the tenth thin-film transistor configured to receive a reset signal, the other one of the tenth thin-film transistor electrically connected to the N-th-stage node; and an eleventh thin-film transistor, one of the source and the drain of the eleventh thin-film transistor configured to receive the constant low voltage level signal, the gate of the eleventh thin-film transistor configured to receive the reset signal, the other one of the eleventh thin-film transistor electrically connected to one of the source and the drain of the third thin-film transistor.

17. The gate drive unit of claim 13, wherein the N-th-stage gate drive unit further comprises:
a first capacitor, a first end of the first capacitor electrically connected to the N-th-stage node and a second end of the first capacitor electrically connected to one of the source and the drain of the third thin-film transistor.

18. The gate drive unit of claim 17, wherein the N-th-stage gate drive unit further comprises:
a twelfth thin-film transistor, one of the source and the drain of the twelfth thin-film transistor configured to receive the constant low voltage level signal, the gate of the twelfth thin-film transistor configured to receive a second global control signal, and the other one of the twelfth thin-film transistor electrically connected to one of the source and the drain of the third thin-film transistor.

19. The gate drive circuit of claim 13, wherein operation cycle of the first clock signal partially overlaps with operation cycle of the second clock signal.

* * * * *